US011624795B2

(12) United States Patent
Tamir et al.

(10) Patent No.: US 11,624,795 B2
(45) Date of Patent: Apr. 11, 2023

(54) SYSTEMS AND METHODS FOR IMPROVING LOW DOSE VOLUMETRIC CONTRAST-ENHANCED MRI

(71) Applicant: Subtle Medical, Inc., Menlo Park, CA (US)

(72) Inventors: Jonathan Tamir, Menlo Park, CA (US); Srivathsa Pasumarthi Venkata, Menlo Park, CA (US); Tao Zhang, Menlo Park, CA (US); Enhao Gong, Menlo Park, CA (US)

(73) Assignee: SUBTLE MEDICAL, INC., Menlo Park, CA (US)

( * ) Notice: Subject to any disclaimer, the term of this patent is extended or adjusted under 35 U.S.C. 154(b) by 0 days.

(21) Appl. No.: 17/702,468

(22) Filed: Mar. 23, 2022

(65) Prior Publication Data
US 2022/0334208 A1    Oct. 20, 2022

Related U.S. Application Data

(63) Continuation of application No. PCT/US2020/052123, filed on Sep. 23, 2020.
(Continued)

(51) Int. Cl.
*G06T 3/00* (2006.01)
*G01R 33/56* (2006.01)
(Continued)

(52) U.S. Cl.
CPC ..... *G01R 33/5608* (2013.01); *G01R 33/5601* (2013.01); *G06T 3/60* (2013.01);
(Continued)

(58) Field of Classification Search
CPC .. G01R 33/5608; G01R 33/5601; G06T 3/60; G06T 5/50; G06T 2207/10088;
(Continued)

(56) References Cited

U.S. PATENT DOCUMENTS

| 10,970,887 B2 | 4/2021 | Wang et al. | |
| 2010/0166273 A1* | 7/2010 | Wismuller | ............ G06T 7/0012 |
| | | | 382/131 |

(Continued)

FOREIGN PATENT DOCUMENTS

| WO | WO-2016033458 A1 * | 3/2016 | ............. A61B 5/055 |
| WO | WO-2021061710 A1 | 4/2021 | |

OTHER PUBLICATIONS

Ameen et al., An extensive review of medical image denoising techniques. J Med Res. 2017; 16:23-27.
(Continued)

*Primary Examiner* — Van D Huynh
(74) *Attorney, Agent, or Firm* — Wilson Sonsini Goodrich & Rosati

(57) ABSTRACT

Methods and systems are provided for improving model robustness and generalizability. The method may comprise: acquiring, using a medical imaging apparatus, a medical image of a subject; reformatting the medical image of the subject in multiple scanning orientations; applying a deep network model to the medical image to improve the quality of the medical image; and outputting an improved quality image of the subject for analysis by a physician.

20 Claims, 13 Drawing Sheets

Related U.S. Application Data

(60) Provisional application No. 62/905,689, filed on Sep. 25, 2019.

(51) Int. Cl.
  *G06T 3/60* (2006.01)
  *G06T 5/50* (2006.01)

(52) U.S. Cl.
  CPC ...... *G06T 5/50* (2013.01); *G06T 2207/10088* (2013.01); *G06T 2207/20084* (2013.01); *G06T 2207/20216* (2013.01); *G06T 2207/30004* (2013.01)

(58) Field of Classification Search
  CPC . G06T 2207/20084; G06T 2207/20216; G06T 2207/30004; G06T 3/0037; G06T 2207/30016; G06T 7/0014; G06T 5/007; G06T 7/337; G06T 7/62; G06T 11/005; G06T 11/008; G06T 19/20; G06T 2207/30096; G06T 2219/2016; A61B 5/0033; A61B 5/055
  USPC ........................................................ 382/108
  See application file for complete search history.

(56) References Cited

U.S. PATENT DOCUMENTS

| | | | |
|---|---|---|---|
| 2014/0304206 A1* | 10/2014 | Lee ........................ | A61B 6/032 706/47 |
| 2015/0238160 A1* | 8/2015 | Flohr ...................... | A61B 6/032 378/8 |
| 2016/0314558 A1* | 10/2016 | Aguirre-Valencia ... | G06T 19/00 |
| 2017/0265820 A1* | 9/2017 | Atria ...................... | A61B 6/4014 |
| 2018/0240219 A1 | 8/2018 | Mentl et al. | |
| 2018/0286037 A1 | 10/2018 | Zaharchuk et al. | |
| 2019/0108634 A1* | 4/2019 | Zaharchuk ................ | G06T 7/50 |
| 2019/0240219 A1* | 8/2019 | Engelhardt ........ | A61K 31/5377 |
| 2022/0343475 A1* | 10/2022 | Zhang ..................... | G06T 5/009 |

OTHER PUBLICATIONS

Andriy Myronenko, 3D MRI brain tumor segmentation using autoencoder regularization. arXiv. 2018; preprint:1810.11654.

Bakas et al., Identifying the Best Machine Learning Algorithms for Brain Tumor Segmentation, Progression Assessment, and Over-all Survival Prediction in the BRATS Challenge. arXiv. 2018; preprint:1811.02629.

Christoph Angermann et al., Projection-Based 2.5D U-net Architecture for Fast Volumetric Segmentation. *arXiv*. 2019; preprint:1902.00347.

Deng et al., ImageNet: A Large-Scale Hierarchical Image Database. *In Proceedings of the IEEE Computer Vision and Pattern Recognition (CVPR)* 2009.

Ellingson et al. Baseline pretreatment contrastenhancing tumor volume including central necrosis is a prognostic factor in recurrent glioblastoma: evidence from single and multicenter trials. Neuro-Oncology. 2016; 19:89-98.

EMA/625317/2017: EMA's final opinion confirms restrictions on use of linear gadolinium agents in body scans. European Medicines Agency web-site. https://www.ema.europa.eu/en/medicines/human/referrals/gadolinium-containing-contrast-agents, Published Dec. 19, 2017. Updated Dec. 19, 2017. Accessed Jun. 24, 2020.

Falk et al. Diagnostic value of alternative techniques to gadolinium-based contrast agents in MR neuroimaging—a comprehensive overview. Insights Imaging. 2019; 10:84.

FDA Drug Safety Communication: FDA warns that gadolinium-based contrastagents (GBCAs) are retained in the body; requires new class warnings. U.S. FDA website. https://www.fda.gov/drugs/drug-safety-and-availability/fda-drug- safety-communication-fda-warns-gadolinium-based-contrast-agents-gbcas- are-retained-body, Published Dec. 19, 2017. Updated May 16, 2018. Accessed Jun. 24, 2020.

Gadolinium-based contrast agents for MRI scans: Safety advisory—potential retentionin the brain but No. known adverse effects. Department of Health: Government of Australia website. https://www.tga.gov.au/alert/gadolinium-based-contrast- agents-mri-scans, Published Jul. 28, 2017. Updated Jul. 28, 2017. Accessed Jun. 24, 2020.

Gondara, L. Medical Image Denoising Using Convolutional Denoising Autoencoders.IEEE 16th International Conference on Data Mining Workshops (ICDMW). 2016.

Grobner, T. Gadolinium—a specific trigger for the development of nephrogenic fibrosingdermopathy and nephrogenic systemic fibrosis? Nephrol Dial Transpl. 2006; 21(4):1104-1108.

H. Sun et al. Substituting Gadolinium in Brain MRI Using DeepContrast. arXiv. 2020; preprint:2001.05551.

Inan et al., Diagnostic Accuracy of Dynamic Contrast Enhanced Magnetic Resonance Imaging in Characterizing Lung Masses. Iran J Radiol. 2016; 13(2).

International Search Report and Written Opinion issued in PCT/US2020/052123 dated Jan. 7, 2021.

Isensee et al., Brain Tumor Segmentation and Radiomics Survival Prediction:Contribution to the BRATS 2017 Challenge. Lect Notes Comput Sc. 2018; 10670:287-297.

Jonathan T. Barron, A General and Adaptive Robust Loss Function. *arXiv*. 2017;preprint:1701.03077.

Justin Johnson et al., Perceptual Losses for Real-Time Style Transfer and Super-Resolution. arXiv. 2016; preprint:1603.08155.

Karen Simonyan et al., Very Deep Convolutional Networks for Large-Scale Image Recognition. In Proceedings of the International Conference on Learning Representations (ICLR) 2015.

Kleesiek et al., Can Virtual Contrast Enhancement in Brain MRI Replace Gadolinium? A Feasibility Study. Invest Radiol. 2019; 54(10):653-660.

Marstal et al., SimpleElastix: A User-Friendly, Multi-lingual Library for Medical Image Registration. *In Proceedings of the IEEE Conference on Computer Vision and Pattern Recognition Workshops (CVPRW)* 2016; :574-582.

McDonald et al. Acute Adverse Events Follow-ing Gadolinium-based Contrast Agent Administration: A Single-Center RetrospectiveStudy of 281,945 Injections. Radiology. 2019; 292:620-627.

McDonald et al. Gadolinium Retention: A Research Roadmap from the 2018 NIH/ACR/RSNA Workshop on Gadolinium Chelates. Radiology. 2018; 289:517-534.

McDonald et al., Signal Intensity Changes at MRI Following GBCA Exposure: Incidental Finding or Cause for Concern? Radiology. 2020; 201256.

Montagne et al., Brain imaging of neurovascular dysfunction in Alzheimer's disease. Acta Neuropathol.2016; 131(5):687-707.

Narayana et al., Deep Learning for Predicting Enhancing Lesions in Multiple Sclerosis from Noncontrast MRI. Radiology. 2019; 294(2):398-404.

Niendorf et al., Contrast Enhanced MRI in the Diag-nosis of HCC. Diagnostics (Basel). 2015; 5(3):383-398.

Nvidia GPU Cloud (NGC). Nvidia Corporation website. https://www.nvidia.com/en-us/gpu-cloud, Accessed Jun. 24, 2020.

O'Connor et al., Dynamic contrast-enhanced imaging techniques: CT and MRI. Brit J Radiol. 2011;84(Special Issue 2):S112-S120.

Peter Klages et al. Comparison of Patch-Based Conditional Generative Adversarial Neural Net Models with Emphasis on Model Robustness for Use in Head and Neck Cases for MR-Only planning. arXiv. 2019;preprint:1902.00536.

Pham et al., Multiscale brain MRI super-resolution using deep 3D convolutional networks. Comput. Med. Imaging Graph. 2019; 77.

Pianykh et al., Modeling Human Perception of Image Quality. *J Digit Imaging.* 2018; 31:768-775.

Rogowska et al., Gadolinium as a new emerging contaminant of aquatic environments. Environ Toxicol Chem. 2018; 37(6):1523-1534.

Rohlfing et al., The SRI24 multichannel atlas of normal adult human brain structure. *Hum Brain Mapp.* 2009; 31(5):798-819.

(56) References Cited

OTHER PUBLICATIONS

S. Zhang et al., A Fast Medical Image Super Resolution Method Based on Deep Learning Network. IEEE Access. 2019; 7:12319-12327.
Schieda et al., Updated Clinical Practice Guideline on Use of Gadolinium-Based Contrast Agents in Kidney Disease Issued by the Canadian Association of Radiologists. Can Assoc Radiol J. 2019;70:226-232.
Shah et al., Imaging of Spinal Metastatic Disease. Int J Surg Oncol.2011; 2011:1-12.
Simon Jenni et al., On Stabilizing Generative Adversarial Training With Noise. *In Proceedings of the 2019 IEEE/CVF Conference on Computer Vision and Pattern Recognition (CVPR)* 2019; :12137-12145.
Sood et al., An application of generative adversarial networks for super resolution medical imaging. In Proceedings of the 17th IEEE International Conference on Machine Learning Applications (ICMLA) 2018; pp. 326-331.
Summary Safety Review—Gadolinium based contrast agents—Assessing the risk of gadolinium build-up in the brain and potential brain and nervous system (neurological) side effects. Government of Canada website. https://www.canada.ca/en/health-canada/services/drugs-health-products/medeffect-canada/safety-reviews/gadolinium-based-contrast-agents-assessing-risk-build-up-in-brain-and-potential-brain-nervous-system-side-effects.html, Published May 1, 2018. Updated May 1, 2018. Accessed Jun. 24, 2020.
Takeru Miyato et al., Spectral Normalization for Generative Adversarial Networks.*In Proceedings of the International Conference on Learning Representations (ICLR)* 2018.
Vahid Ghodrati et al., MR image reconstruction using deep learning: evaluation of network structure and loss functions. Quant Imaging Med Surg.2019; 9(9):1516-1527.
Wesolowski et al., Alternatives to GBCA: Are we there yet? Top Magn Reson Imag 2016; 25(4):171-175.
Wolterink et al., Deep MR to CT Synthesis Using Unpaired Data. Lect Notes Comput Sc. 2017;10557:14-23.
Yunzhe Xue et al., A multi-path 2.5 dimensional convolutional neural network system for segmenting stroke lesions in brain MRI images. *arXiv.* 2019; preprint:1905.10835.
Zacharaki et al., Classification of brain tumor type and grade using MRI texture and shape in a machine learning scheme. Magn Reson Med.2009; 62(6):1609-1618.
Zhang et al.,The Diagnostic Value of MRI-Based Texture Analysis in Discrimination of Tumors Located in Posterior Fossa: A Preliminary Study. *Front Neurosci-Switz.* 2019; 13:Article 1113.
E. Gong, J. M. Pauly, M. Wintermark, and G. Zaharchuk, "Deep learning enables reduced gadolinium dose for contrast-enhanced brain mri," Journal of Magnetic Resonance Imaging, vol. 48, No. 2, pp. 330-340, 2018.

GitHub: Ivan Itzkovich. Brain image processing tools using Deep Learning focused on speed and accuracy. https://github.com/iitzco/deepbrain, Published Aug. 17, 2018. Updated Sep. 24, 2018. Accessed Feb. 1, 2023.
N. C. Silver, C. D. Good, G. J. Barker, D. G. MacManus, A. J. Thompson, I. F. Moseley, W. I. McDonald, and D. H. Miller, "Sensitivity of contrast enhanced MRI in multiple sclerosis. Effects of gadolinium dose, magnetization transfer contrast and delayed imaging.," Brain, vol. 120, pp. 1149-1161, Jul. 1997.
N. Murata, L. F. Gonzalez-Cuyar, K. Murata, C. Fligner, R. Dills, D. Hippe, and K. R. Maravilla, "Macrocyclic and other non-group 1 gadolinium contrast agents deposit low levels of gadolinium in brain and bone tissue: Preliminary results from 9 patients with normal renal function," Investigative Radiology, vol. 51, No. 7, 447-453 2016.
M. A. Zahra, K. G. Hollingsworth, E. Sala, D. J. Lomas, and L. T. Tan, "Dynamic contrast-enhanced mri as a predictor of tumour response to radiotherapy," The Lancet Oncology, vol. 8, No. 1, pp. 63-74, 2007.
M. Burrel, J. M. Llovet, C. Ayuso, C. Iglesias, M. Sala, R. Miquel, T. Caralt, J. R. Ayuso, M. Sole, M. Sanchez, C. Brú, and J. Bruix, "Mri angiography is superior to helical ct for detection of hcc prior to liver transplantation: An explant correlation," Hepatology, vol. 38, No. 4, pp. 1034-1042, 2003.
R. C. Brasch, H. J. Weinmann, and G. E. Wesbey, "Contrast-enhanced nmr imaging: animal studies using gadolinium-dtpa complex," American Journal of Roentgenology, vol. 142, pp. 625-630, Mar. 1984.
O. Ronneberger, P. Fischer, and T. Brox, "U-net: Convolutional networks for biomedical image segmentation," in Medical Image Computing and Computer-Assisted Intervention—MICCAI, Springer International Publishing, pp. 234-241, 2015.
P. Klages, I. Benslimane, S. Riyahi, J. Jiang, M. Hunt, J. Deasy, H. Veeraraghavan, and N. Tyagi, "Comparison of Patch-Based Conditional Generative Adversarial Neural Net Models with Emphasis on Model Robustness for Use in Head and Neck Cases for MR-Only planning," arXiv e-prints, p. arXiv:1902.00536, Feb. 2019.
R. J. McDonald, J. S. McDonald, D. F. Kallmes, M. E. Jentoft, D. L. Murray, K. R. Thielen, E. E. Williamson, and L. J. Eckel, "Intracranial gadolinium deposition after contrast-enhanced mr imaging," Radiology, vol. 275, No. 3, pp. 772-782, 2015.
V. Gulani, F. Calamante, F. G. Shellock, E. Kanal, and S. B. Reeder, "Gadolinium deposition in the brain: summary of evidence and recommendations," The Lancet Neurology, vol. 16, No. 7, pp. 564-570, 2017.
Wu et al. Image synthesis in contrast MRI based on super resolution reconstruction with multi-refinement cycle-consistent generative adversarial networks. J Intell Manuf. Nov. 1, 2019:1:1-14.
Zhao et al., Loss Functions for Image Restoration With Neural Networks. IEEE Trans. Comput. Imag. 2017; 3(1):47-57.
Zhou Wang, A. C. Bovik, H. R. Sheikh, and E. P. Simoncelli, "Image quality assessment: from error visibility to structural similarity," IEEE Transactions on Image Processing, vol. 13, No. 4, pp. 600-612, Apr. 2004.

\* cited by examiner

Table 1: MRI scanning heterogeneity across two sites.

| | Scanner | Scan plane | Resolution | Matrix size | Relative SNR | Fat suppression | Contrast injection |
|---|---|---|---|---|---|---|---|
| Site 1 | Siemens Skyra 3T | Axial | .5×.5×1 mm³ | 160×512×512 | 130% | On | Power injection |
| Site 2 | Siemens Verio 3T | Sagittal | .78×.78×.8 mm³ | 224×320×320 | 100% | Off | Manual injection |

*FIG. 2*

| Institution/ Manufacturer | No. of train(test) cases | Scanner model(s)/ (Field strength) | Acquisition plane/ Resolution (mm³) / Matrix size | Fat suppression | Contrast agent |
|---|---|---|---|---|---|
| Site A / GE | 28(442) | Discovery MR750w (3T), Discovery MR750 (3T), SIGNA PET/MR (3T), Signa HDxt (1.5T) | Axial/ 0.46 × 0.46 × 1.0 / 512 × 512 × 300 | Off | Gadobenate dimeglumine |
| Site A / Siemens | 0(23) | Skyra (3T) | Axial/ 0.46 × 0.46 × 1.0 / 512 × 512 × 168 | Off | Gadobenate dimeglumine |
| Site B / Philips | 17(70) | Ingenia CX (3T) | Sagittal/ 1.0 × 1.0 × 1.0 / 240 × 240 × 180 | Off | Gadoterate meglumine |
| Site B / Siemens | 8(15) | Prisma (3T) | Sagittal/ 1.0 × 1.0 × 1.0 / 232 × 256 × 180 | Off | Gadoterate meglumine |
| Site C / Siemens | 10(21) | Verio (3T) | Sagittal/ 0.75 × 0.75 × 0.8 / 320 × 320 × 224 | On for low and full-dose | Gadobutrol |

FIG. 10

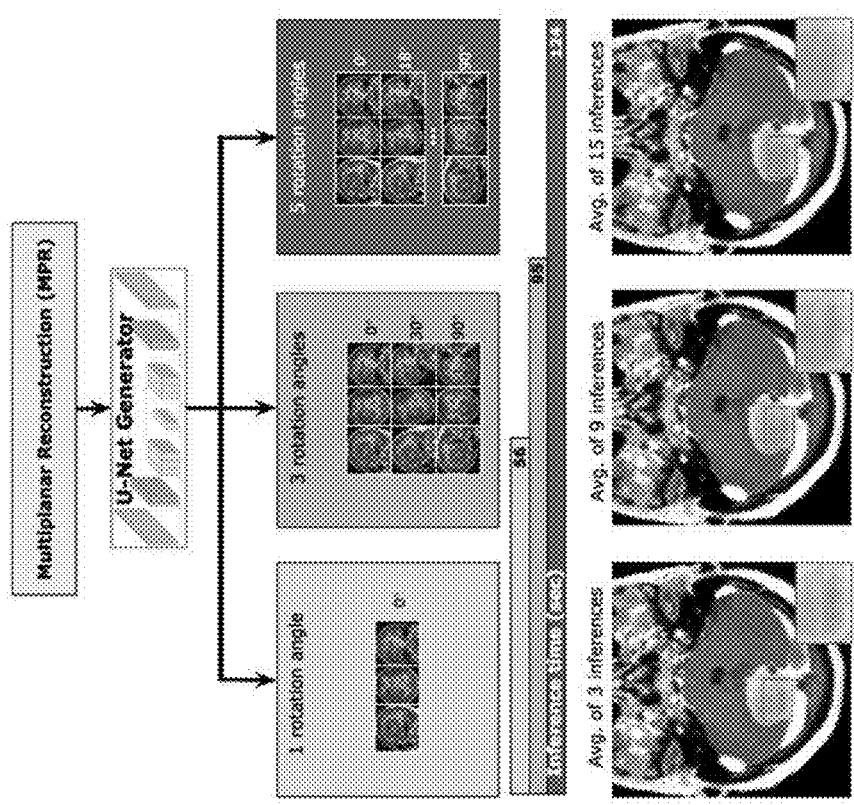

SYSTEMS AND METHODS FOR IMPROVING LOW DOSE VOLUMETRIC CONTRAST-ENHANCED MRI

CROSS-REFERENCE TO RELATED APPLICATION

This application is a continuation of International Application No. PCT/US2020/052123, filed on Sep. 23, 2020, which claims priority to U.S. Provisional Application No. 62/905,689 filed on Sep. 25, 2019, the content of which is incorporated herein in its entirety.

STATEMENT AS TO FEDERALLY SPONSORED RESEARCH

This invention was made with government support under Grant No. R44 EB027560 awarded by the National Institutes of Health. The government has certain rights in the invention.

BACKGROUND

Contrast agents such as Gadolinium-based contrast agents (GBCAs) have been used in approximately one third of Magnetic Resonance imaging (MRI) exams worldwide to create indispensable image contrast for a wide range of clinical applications, but pose health risks for patients with renal failure and are known to deposit within the brain and body for patients with normal kidney function. Recently, deep learning technique has been used to reduce GBCA dose in volumetric contrast-enhanced MRI, but challenges in generalizability remain due to variability in scanner hardware and clinical protocols within and across sites.

SUMMARY

The present disclosure provides improved imaging systems and methods that can address various drawbacks of conventional systems, including those recognized above. Methods and systems as described herein can improve image quality with reduced dose level of contrast agent such as Gadolinium-Based Contrast Agents (GBCAs). In particular, a generalized deep learning (DL) model is utilized to predict contrast-enhanced images with contrast dose reduction across different sites and scanners.

Traditionally, contrast agent such as Gadolinium-Based Contrast Agents (GBCAs) and others has been used in a wide range of contrast-enhanced medical imaging such as Magnetic Resonance Imaging (MRI), or nuclear magnetic resonance imaging, for examining pathology, predicting prognosis and evaluating treatment response for gliomas, multiple sclerosis (MS), Alzheimer's disease (AD), and the like. GBCAs are also pervasive in other clinical applications such as evaluation of coronary artery disease (CAD), characterization of lung masses, diagnosis of hepatocellular carcinoma (HCC), imaging of spinal metastatic disease. In 2006, an association between GBCA administration and the development of nephrogenic systemic fibrosis (NSF) in patients with impaired renal function was identified. Other acute side-effects of GBCAs in subjects with normal renal function include hypersensitivity, nausea, and chest pain. Subsequently, in 2017, U.S. FDA issued warnings and safety measures related to Gadolinium retention, while the regulatory bodies of Canada, Australia and other countries issued similar warnings. In addition to safety advisories, the European Medicines Agency has suspended the use of linear GBCAs. Gadolinium retention has not only been reported in the CNS tissue in the form of hyper-intensities on non-enhanced T1W MRI, but also in other parts of the body. Environmental sustainability concerns are also being raised as gadolinium is an emerging water pollutant. Other disadvantages of contrast-enhanced scans include patient inconvenience during intravenous injection, prolonged scan time, and an overall increase in imaging costs. Even though GBCAs have a good pharmacovigilance safety profile, there is a clear need for dose reduction due to the abovementioned safety issues and concerns. In particular, it is desirable to provide a safe imaging technique where the contrast dose can be reduced regardless the properties or type of the contrast materials without comprising the imaging quality or introducing additional safety issues.

Recent developments in Deep learning (DL) or machine learning (ML) techniques enable it as a potential alternative to the use of contrast dose. DL/ML has found a plethora of applications in medical imaging which includes denoising, super-resolution and modality conversion of, e.g., MRI to CT, $T_1$ to $T_2$. DL model has the potential to be used for generating contrast-enhanced images using a small fraction of the standard dose and the pre-contrast images. Although such method may be able to reduce dose levels while maintaining non-inferior image quality, the DL enhanced images often suffer from artifacts such as streaks on a reformat image (e.g., reformatted volumetric image or reconstructed 3D image viewed from different planes, orientations or angles).

There exists a need for providing a robust DL model that is generalized for (sometimes agnostic to) diverse clinical settings such as different scanner vendors, scan protocols, patient demographics, and clinical indications. Such a model is also desired to produce artifact-free images and support a variety of clinical use cases such as multiplanar reformat (MPR) for oblique visualizations of 3D images, thus enabling the model to be deployed and integrated within a standard clinical workflow.

Systems and methods described herein can address the abovementioned drawbacks of the conventional solutions. In particular, the provided systems and methods may involve a DL model including a unique set of algorithms and methods that improve the model robustness and generalizability. The algorithms and methods may include, for example, multiplanar reconstruction, 2.5D deep learning model, enhancement-weighted L1, perceptual and adversarial losses algorithms and methods, as well as pre-processing algorithms that are used to pre-process the input pre-contrast and low-dose images prior to the model predicting the corresponding contrast-enhanced images.

In an aspect, a method is provided for computer-implemented method for improving image quality with reduced dose of contrast agent. The method comprises: acquiring, using a medical imaging apparatus, a medical image of a subject with a reduced dose of contrast agent; reformatting the medical image of the subject in multiple orientations to generate a plurality of reformat medical images; and applying a deep network model to the plurality of reformat medical images to generate a predicted medical image with improved quality.

In a related yet separated aspect, a non-transitory computer-readable storage medium including instructions that, when executed by one or more processors, cause the one or more processors to perform operations. The operations comprise: acquiring, using a medical imaging apparatus, a medical image of a subject with a reduced dose of contrast agent; reformatting the medical image of the subject in multiple orientations to generate a plurality of reformat medical images; and applying a deep network model to the plurality of reformat medical images to generate a predicted medical image with improved quality.

In some embodiments, the medical imaging apparatus is a transforming magnetic resonance (MR) device. In some embodiments, the medical image is a 2.5D volumetric image.

In some embodiments, the multiple orientations include at least one orientation that is not in the direction of the scanning plane. In some embodiments, the method or the operations further comprise rotating each of the plurality of reformat medical images into various angles to generate a plurality of rotated reformat medical images. In some cases, the deep network model is applied to the plurality of rotated reformat medical images to output a plurality of predicted images. The plurality of predicted images as an output of the deep network model are rotated to be aligned to a scanning plane. In some instances, the method or the operations further comprise averaging the plurality of predicted images after rotated to be aligned to the scanning plane to generate the predicted medical image with improved quality. In some embodiments, the predicted medical image with improved quality is obtained by averaging a plurality of predicted medical images corresponding to the plurality of the reformat medical images.

Additionally, methods and systems of the present disclosure may be applied to existing systems without a need of a change of the underlying infrastructure. In particular, the provided methods and systems may reduce the dose level of contrast agent at no additional cost of hardware component and can be deployed regardless of the configuration or specification of the underlying infrastructure.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and descriptions are to be regarded as illustrative in nature, and not as restrictive

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIG. 2 shows an example of data collected from the two different sites.

FIG. 10 shows an experiment including data distribution and heterogeneity of a study dataset from three institutions, three different manufacturers, and eight different scanner models.

FIG. 13 shows examples illustrating effect of the number of rotation angles in MPR on the quality of the output image and processing time.

DETAILED DESCRIPTION

Figure 1:
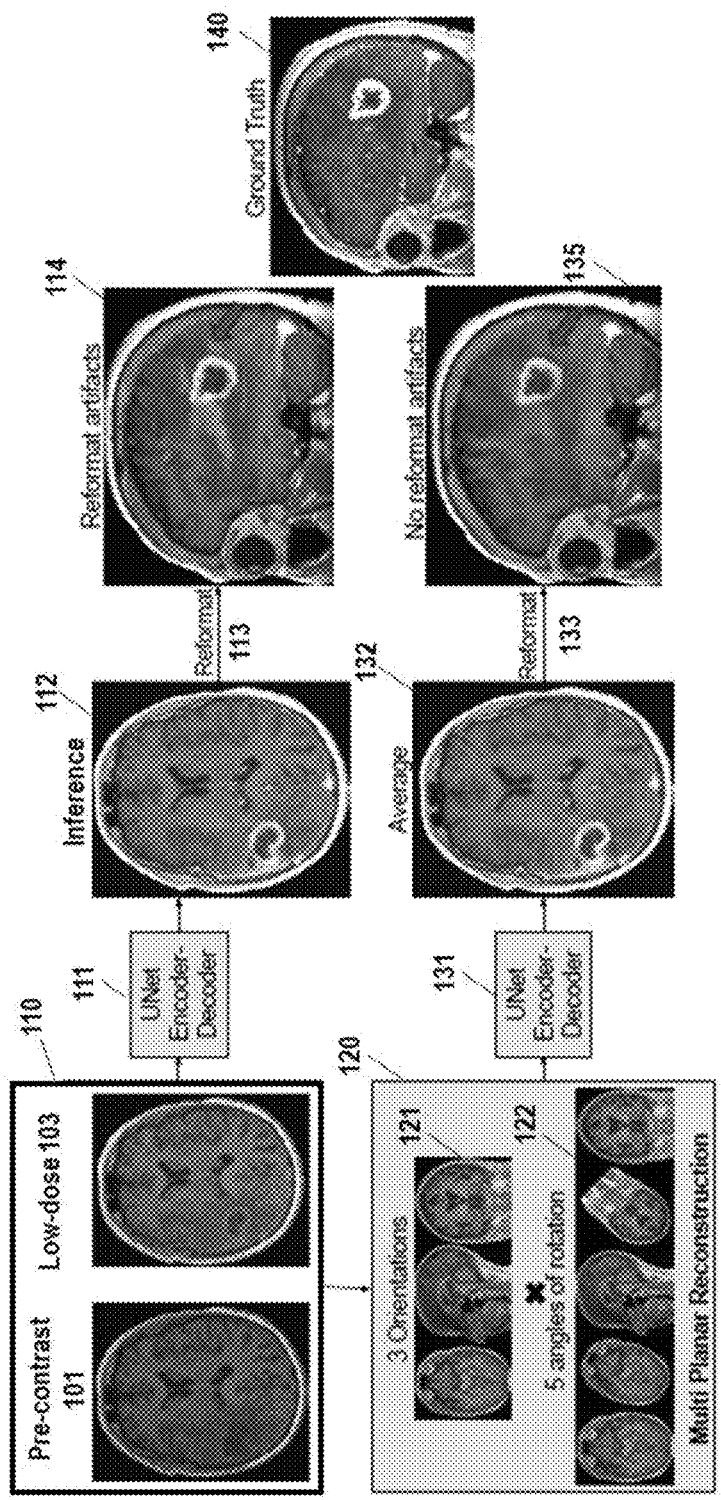
FIG. 1 shows an example of a workflow for processing and reconstructing magnetic resonance imaging (MRI) volumetric image data.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Gadolinium-based contrast agents (GBCAs) are widely used in magnetic resonance imaging (MRI) exams and have been indispensable for monitoring treatment and investigating pathology in myriad applications including angiography, multiple sclerosis and tumor detection. Recently, the identification of prolonged gadolinium deposition within the brain and body has raised safety concerns about the usage of GBCAs. Reducing the GBCA dose reduces the degree of deposition, but also degrades contrast enhancement and tumor conspicuity. A reduced dose exam that retains contrast enhancement is therefore greatly relevant for patients who need repeated contrast administration (e.g., multiple sclerosis patients) and are at high risk of gadolinium deposition (e.g., children).

Though MRI, Gadolinium-based contrast agents, MRI data examples are primarily provided herein, it should be understood that the present approach can be used in other imaging modality contexts and/or other contrast-enhanced imaging. For instance, the presently described approach may be employed on data acquired by other types of tomographic scanners including, but not limited to, computed tomography (CT), single photon emission computed tomography (SPECT) scanners, Positron Emission Tomography (PET), functional magnetic resonance imaging (fMRI), or various other types of imaging scanners or techniques wherein a contrast agent may be utilized for enhancing the contrast.

Deep learning (DL) framework has been used to reduce GBCA dose levels while maintaining image quality and contrast enhancement for volumetric MRI. As an example, a DL model may use a U-net encoder-decoder architecture to enhance the image contrast from a low-dose contrast image. However, the conventional DL models may only work well with scans from a single clinical site without considering generalizability to different sites with different clinical workflows. Moreover, the conventional DL models may evaluate image quality for individual 2D slices in the 3D volume, even though clinicians frequently require volumetric images to visualize complex 3D enhancing structures such as blood vessels and tumors from various angles or orientations.

The present disclosure provides systems and methods that can address various drawbacks of conventional systems, including those recognized above. Methods and systems of the presenting disclosure capable of improving model robustness and deployment in real clinical settings. For instance, the provided methods and systems are capable of adapting to different clinical sites, each with different MRI scanner hardware and imaging protocols. In addition, the provided methods and systems may provide improved performance while retaining multi-planar reformat (MPR) capability to maintain the clinician workflow and enable oblique visualizations of the complex enhancing microstructure.

Methods and systems herein may provide enhancements to the DL model to tackle real-world variability in clinical settings. The DL model is trained and tested on patient scans from different hospitals across different MRI platforms with different scanning planes, scan times, and resolutions, and with different mechanisms for administering GBCA. The robustness of the DL models may be improved in these settings with improved generalizability across a heterogeneity of data.

Multi-Planar Reformat (MPR)

In a conventional DL pipeline, 2D slices from the 3D volume may be separately processed and trained with standard 2D data augmentation (e.g. rotations and flips). The choice of a 2D model is often motivated by memory limitations during training, and performance requirements during inference. In some cases, DL framework may process the data in a "2.5D" manner, in which multiple adjacent slices are input to a network and the central slice is predicted. However, both 2D and 2.5D processing may neglect the true volumetric nature of the acquisition. As the 3D volume is typically reformatted into arbitrary planes during the clinical workflow (e.g., oblique view, views from orientations/angles that are oblique to the scanning plane/orientation), and sites may use a different scanning orientation as part of their MRI protocol, 2D processing can lead to images with streaking artifacts in the reformat volumetric images (e.g., reformat into planes that are orthogonal to the scanning plane).

Methods and systems described herein may beneficially eliminate the artifacts (e.g., streaking artifacts) in reformat images thereby enhancing the image quality with reduced contrast dose. As described above, reformatting a 3D volume image to view the image in multiple planes (e.g., orthogonal or oblique planes) is common in a standard clinical workflow. In some cases, though training a model to enhance the 2.5D image may reduce the streaking artifacts in the plane of acquisition, reformatting to other orientations may still cause streaking artifacts. Methods and systems as described herein may enable artifact-free visualizations in any selected plane or viewing direction (e.g., oblique view). Additionally, the model may be trained to learn intricate or complex 3D enhancing structures such as blood vessels or tumors.

FIG. 1 shows an example of a workflow for processing and reconstructing MRI volumetric image data. As illustrated in the example, the input image 110 may be image slices that are acquired without contrast agent (e.g., pre-contrast image slice 101) and/or with reduced contrast dose (e.g., low-dose image slice 103). In some cases, the raw input image may be 2D image slices. A deep learning (DL) model such as a U-net encoder-Decoder 111 model may be used to predict an inference result 112. While the DL model 111 may be a 2D model that is trained to generate an enhanced image within each slice, it may produce inconsistent image enhancement across slices such as streaking artifacts in image reformats. For instance, when the inference result is reformatted 113 to generate a reformat image in the orthogonal direction 114, because the input 2D image 110 matches the scanning plane, the reformat image 114 may contain reformat artifacts such as streaking artifacts in the orthogonal directions.

Such reformat artifacts may be alleviated by adopting a multi-planar reformat (MPR) method 120 and using a 2.5D trained model 131. The MPR method may beneficially augment the input volumetric data in multiple orientations. As shown in FIG. 1, a selected number of input slices of the pre-contrast or low-dose images 110 may be stacked channel-wise to create a 2.5D volumetric input image. The number of input slices for forming the 2.5D volumetric input image can be any number such as at least two, three, four, five, six, seven, eight, nine, ten slices may be stacked. In some cases, the number of input slices may be determined based on the physiologically or biochemically important structures in regions of interest such as microstructures where a volumetric image without artifacts are highly desired. For instance, the number of input slices may be selected such that microstructure (e.g., blood vessels or tumors) may be mostly contained in the input 2.5D volumetric image. Alternatively or additionally, the number of slices may be determined based on empirical data or selected by a user. In some cases, the number of slices may be optimized according the computational power and/or memory storage of the computing system.

Next, the input 2.5D volumetric image may be reformatted into multiple axes such as principal axes (e.g., sagittal, coronal, and axial) to generate multiple reformatted volumetric images 121. The multiple orientations for reformatting the 2.5D volumetric images may be in any suitable directions that need not be aligned to the principal axes. Additionally, the number of orientations for reformatting the volumetric images can be any number greater than one, two, three, four, five and the like so long as at least one of the multiple reformatted volumetric images is along an orientation that is oblique to or orthogonal to the scanning plane.

At inference stage, each of the multiple reformatted volumetric images may be rotated by a series of angles to produce a plurality of rotated reformat volumetric images 122 thereby further augmenting the input data. For example, each of the three reformatted volumetric images 121 (e.g., sagittal, coronal, and axial) may be rotated by five equispaced angles between 0-90° resulting in 15 volumetric images 122. It should be noted that the angle step and the angle range can be in any suitable range. For example, the angle step may not be a constant and the number of rotational angles can vary based on different applications, cases, or deployment scenarios. In another example, the volumetric images can be rotated across any angle range that is greater than, smaller than or partially overlapping with 0-90°. The effect of the number of the rotational angles on the predicted MPR images are described later herein.

The plurality of rotated volumetric 2.5D images 122 may then be fed to the 2.5D trained model 131 for inference. The output of the 2.5D trained model includes a plurality of contrast-enhanced 2.5D volumetric images. In some cases, the final inference result 132, which is referred to as the "MPR reconstruction", may be an average of the plurality of contrast-enhanced 2.5D volumetric images after rotating back to the original acquisition/scanning plane. For instance, the 15 enhanced 2.5D volumetric images may be rotated back to be aligned to the scanning plane and the mean of such volumetric images is the MPR reconstruction or the final inference result 132. The plurality of predicted 2.5D volumetric images may be rotated to be aligned to the original scanning plane or the same orientation such that an average of the plurality of 2.5D volumetric images may be computed. The plurality of enhanced 2.5D volumetric images may be rotated to be aligned to the same direction that may or may not be in the original scanning plane. The MPR reconstruction method beneficially allows to add a 3D context to the network while benefitting from the performance gains of 2D processing.

Figure 3:
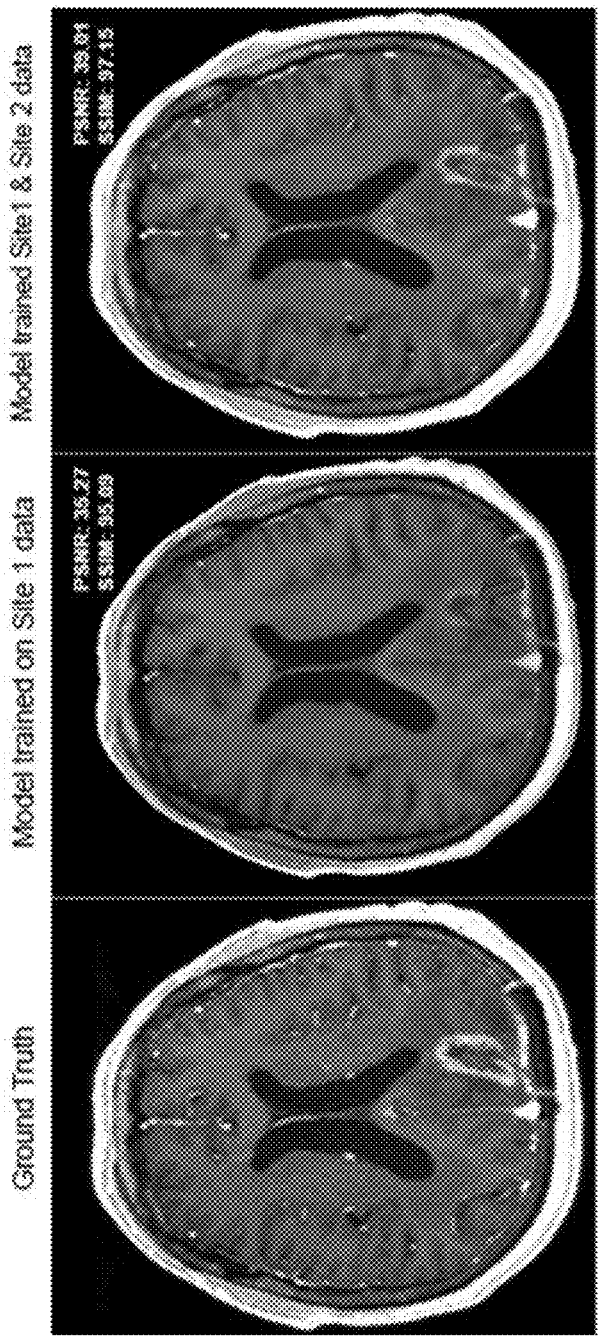
FIG. 3 shows the analytic results of a study.

As illustrated in FIG. 1, when the MPR reconstruction image 132 is reformatted 133 into a plane orthogonal to the original acquisition plane, the reformat image 135 does not present streaking artifacts. The quality of the predicted MPR reconstruction image may be quantified by quantitative image quality metrics such as peak signal to noise ratio (PSNR), and structural similarity (SSIM). The image quality metrics are calculated for the conventional model 111 and the presented model 131, and an example of the result showing the quality of the reformat images 114, 135 and ground truth 140 are illustrated in FIG. 3.

Data Collection

In an example, under IRB approval and patient consent, the scanning protocol was implemented in two sites. FIG. 2 shows the example of data collected from the two sites. 24 patients (16 training, 8 testing) were recruited from Site 1 and 28 (23 training, 5 testing) from Site 2. Differences between scanner hardware and protocol are highlighted in Table 1. In particular, the two sites used different scanner hardware, and had great variability in scanning protocol. Notably, Site 1 used power injection to administer GBCA, while Site 2 used manual injection, leading to differences in enhancement time and strength.

As an example of collecting data for training the model, multiple scans with reduced dose level as well as a full-dose scan may be performed. The multiple scans with reduced dose level may include, for example, a low-dose (e.g., 10%) contrast-enhanced MRI and a pre-contrast (e.g., zero contrast) may be performed. For instance, for each participant, two 3D $T_1$-weighted images were obtained: pre-contrast and post-10% dose contrast (0.01 mmol/kg). For training and clinical validation, the remaining 90% of the standard contrast dose (full-dose equivalent, 100%-dose) was administrated and a third 3D $T_1$-weighted image (100%-dose) was obtained. Signal normalization is performed to remove systematic differences (e.g., transmit and receive gains) that may have caused signal intensity changes between different acquisitions across different scanner platforms and hospital sites. Then, nonlinear affine co-registration between pre-dose, 10%-dose, and 100%-dose images are performed. The DL model used a U-Net encoder-decoder architecture, with the underlying assumption that the contrast-related signal between pre-contrast and low-dose contrast-enhanced images was nonlinearly scaled to the full-dose contrast images. Additionally, images from other contrasts such as $T_2$ and $T_2$-FLAIR can be included as part of the input to improve the model prediction.

Figure 5:
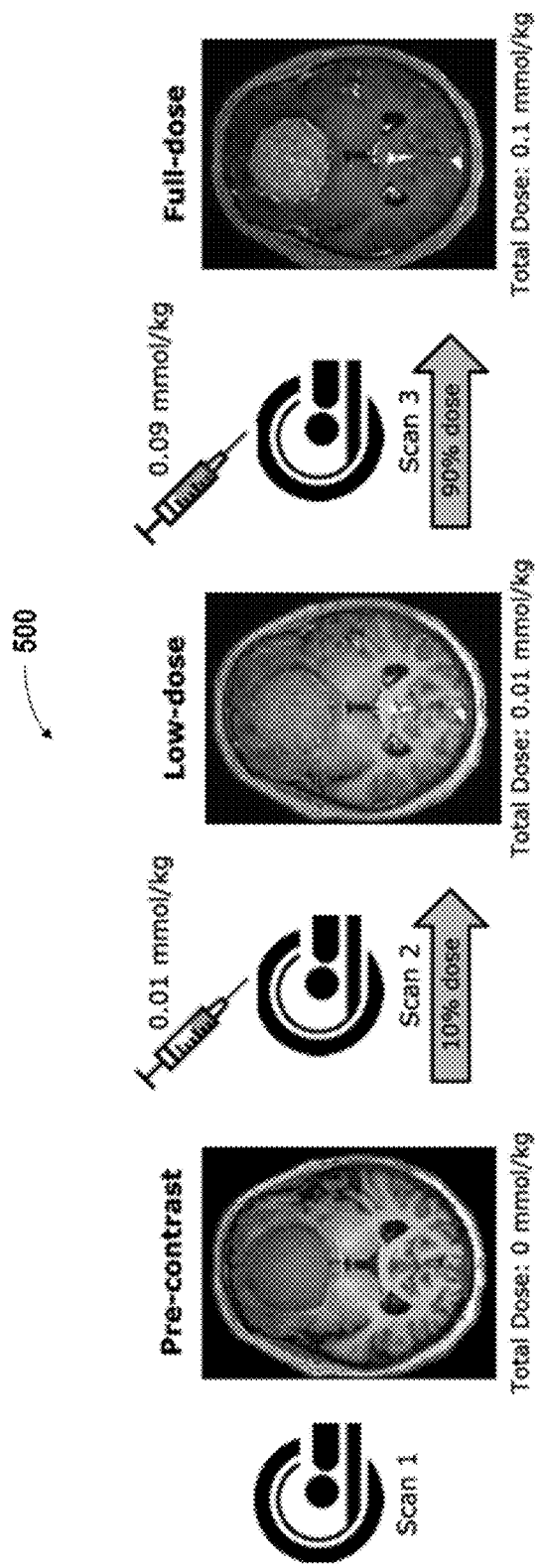
FIG. 5 shows an example of a scan procedure or scanning protocol utilized for collecting the experiment data in the study.

FIG. 5 shows an example of a scan procedure or scanning protocol 500 utilized for collecting data for the studies or experiments shown in FIGS. 2, 3, and 10-12. In the illustrated scan protocol, each patient underwent three scans in a single imaging session. Scan 1 was pre-contrast 3D $T_1$-weighted MRI, followed by Scan 2 with 10% of the standard dose of 0.1 mmol/kg. Images from Scan 1 and 2 were used as input to the DL network. Ground truth images were obtained from Scan 3, after administering the remaining 90% of the contrast dose (i.e., full dose).

During inference, after deployment of the provided systems, only one scan without contrast agent (e.g., similar to scan 1), or a scan with reduced contrast dose (e.g., similar to scan 2) may be performed. Such input image data may then be processed by the trained model to output a predicted MPR reconstructed image with enhanced contrast. In some cases, after deploying the model to a clinical site, a user (e.g., physician) may be permitted to choose a reduced dose level that can be any level in the range from 0 to 30% for acquiring the medical image data. It should be noted that depending on the practical implementation and user desired dose reduction level, the reduced dose level can be any number in a range greater than 30%.

Inter-Site Generalizability

The conventional model may be limited by evaluating patients from a single site with identical scanning protocol. In real clinical settings, each site may tailor its protocol based on the capabilities of the scanner hardware and standard procedures. For example, a model trained on Site 2 may perform poorly on cases from Site 1 (FIG. 2, middle).

The provided DL model may have improved generalizability. The DL model may be trained with a proprietary training pipeline. For example, the training pipeline may comprise first scaling each image to a nominal resolution of 1 mm$^3$ and in-plane matrix size of 256×256, followed by applying the MPR processing. As the DL model is fully convolutional, inference can be run at the native resolution of the acquisition without resampling.

Based on the qualitative and quantitative results, the addition of MPR processing, resolution re-sampling, and inter-site training led to great improvement in model robustness and generalizability. In optional embodiments, the model may be a full 3D model. For instance, the model may be a 3D patch-based model that may alleviate both MPR processing, and memory usage. The provided training methods and model framework may be applied to different sites with different scanner platforms, and/or across different MRI vendors.

Network Architecture and Processes

Figure 6:
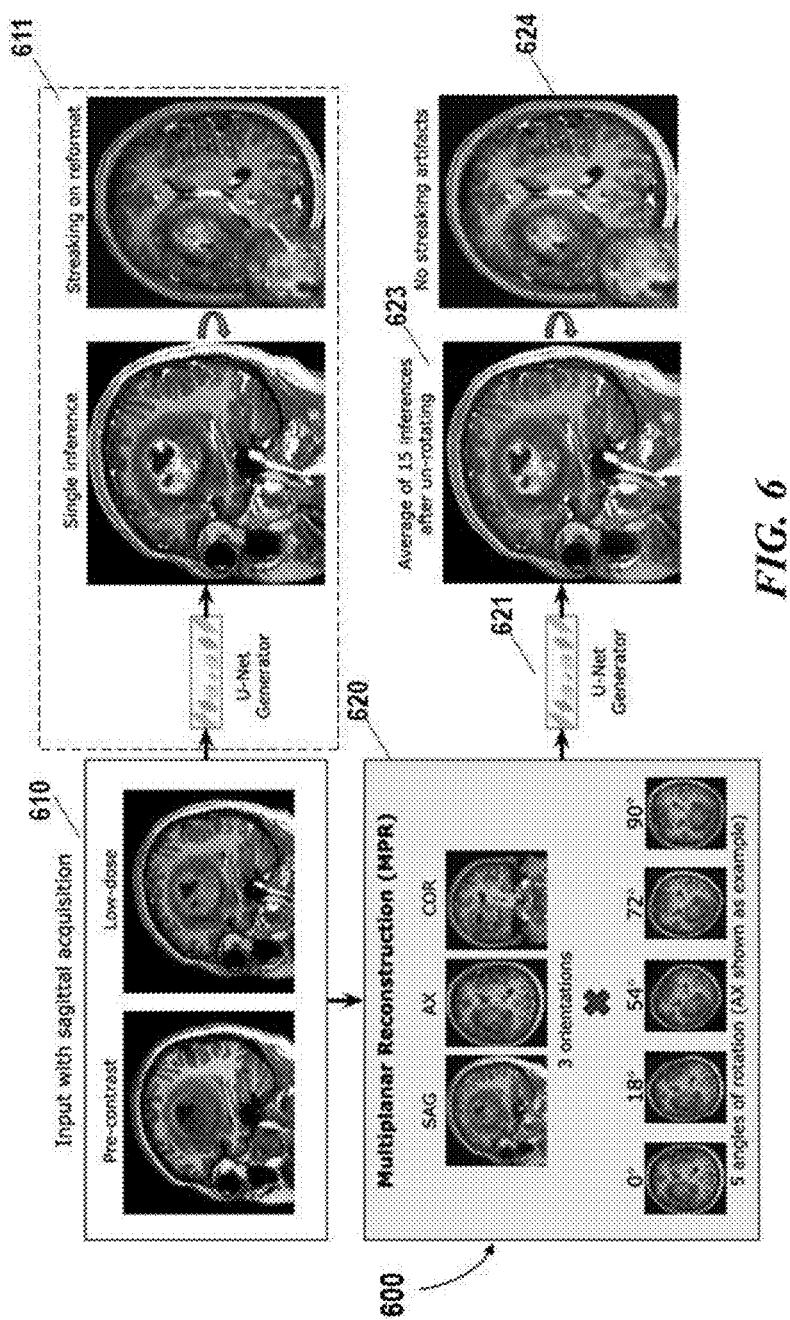
FIG. 6 illustrates an example of a reformat MPR reconstructed image that have a quality improved over the reformat MRI image generated using the conventional method.

FIG. 6 schematically illustrates another example of an MPR reconstructed image 624 that have improved quality compared to the MRI image predicted using the conventional method 611. The workflow 600 for processing and reconstructing MRI volumetric image data 623 and the reformat MPR reconstructed image 624 can be the same as those as described in FIG. 1. For example, the input image 610 may include a plurality of 2D image slices that are acquired without contrast agent (e.g., pre-contrast image slice) and/or with reduced contrast dose (e.g., low-dose image slice). The input images may be acquired in a scanning plane (e.g., axial) or along a scanning orientation. A selected number of the image slices are stacked to form a 2.5D volumetric input image which is further processed using the multiplanar reconstruction (MPR) method 620 as described above.

For example, the input 2.5D volumetric image may be reformatted into multiple axes such as principal axes (e.g., sagittal, coronal, and axial) to generate multiple reformatted volumetric images (e.g., SAG, AX, COR). It should be noted that the 2.5D volumetric image can be reformatted into any orientations that may or may not be aligned with the principal axes.

Each of the multiple reformatted volumetric images may be rotated by a series of angles to produce a plurality of rotated reformat images. For example, each of the three reformatted volumetric images (e.g., sagittal, coronal, and axial) may be rotated by five angles between 0-90° resulting in 15 rotated reformat volumetric images. The multiple reformatted volumetric images (e.g., sagittal, coronal, and axial) may or may not be rotated at the same angle or rotated into the same number of orientations.

The plurality of rotated volumetric images 122 may then be processed by the trained model 621 to produce a plurality of enhanced volumetric images. In some cases, the MPR reconstruction image 623 or the inference result image is the average of the plurality of inference volumes after rotating back to the original plane of acquisition. The MPR reconstruction image when is reformatted to be viewed at a selected orientation (e.g., orthogonal/oblique to the scanning plane), the reformat image 624 may not contain streaking artifacts compared to the reformat image obtained using the single inference method 611 and/or the single inference model.

Network Architecture and Data Processing

Using the multiplanar reconstruction (MPR) technique, the deep learning model may be trained with volumetric images (e.g., augmented 2.5D images) such as from the multiple orientations (e.g., three principal axes). The model may be a trained deep learning model for enhancing the quality of volumetric MRI images acquired using reduced contrast dose. In some embodiments, the model may include an artificial neural network that can employ any type of neural network model, such as a feedforward neural network, radial basis function network, recurrent neural network, convolutional neural network, deep residual learning network and the like. In some embodiments, the machine learning algorithm may comprise a deep learning algorithm such as convolutional neural network (CNN). Examples of machine learning algorithms may include a support vector machine (SVM), a naïve Bayes classification, a random forest, a deep learning model such as neural network, or other supervised learning algorithm or unsupervised learning algorithm. The model network may be a deep learning network such as CNN that may comprise multiple layers. For example, the CNN model may comprise at least an input layer, a number of hidden layers and an output layer. A CNN model may comprise any total number of layers, and any number of hidden layers. The simplest architecture of a neural network starts with an input layer followed by a sequence of intermediate or hidden layers, and ends with output layer. The hidden or intermediate layers may act as learnable feature extractors, while the output layer in this example provides 2.5D volumetric images with enhanced quality (e.g., enhanced contrast). Each layer of the neural network may comprise a number of neurons (or nodes). A neuron receives input that comes either directly from the input data (e.g., low quality image data, image data acquired with reduced contrast dose, etc.) or the output of other neurons, and performs a specific operation, e.g., summation. In some cases, a connection from an input to a neuron is associated with a weight (or weighting factor). In some cases, the neuron may sum up the products of all pairs of inputs and their associated weights. In some cases, the weighted sum is offset with a bias. In some cases, the output of a neuron may be gated using a threshold or activation function. The activation function may be linear or non-linear. The activation function may be, for example, a rectified linear unit (ReLU) activation function or other functions such as saturating hyperbolic tangent, identity, binary step, logistic, arcTan, softsign, parameteric rectified linear unit, exponential linear unit, softPlus, bent identity, softExponential, Sinusoid, Sinc, Gaussian, sigmoid functions, or any combination thereof.

In some embodiments, the network may be an encoder-decoder network or a U-net encoder-decoder network. A U-net is an auto-encoder in which the outputs from the encoder-half of the network are concatenated with the mirrored counterparts in the decoder-half of the network. The U-net may replace pooling operations by upsampling operators thereby increasing the resolution of the output.

In some embodiments, the model for enhancing the volumetric image quality may be trained using supervised learning. For example, in order to train the deep learning network, pairs of pre-contrast and low-dose images as input and the full-dose image as the ground truth from multiple subjects, scanners, clinical sites or databases may be provided as training dataset.

Figure 7:
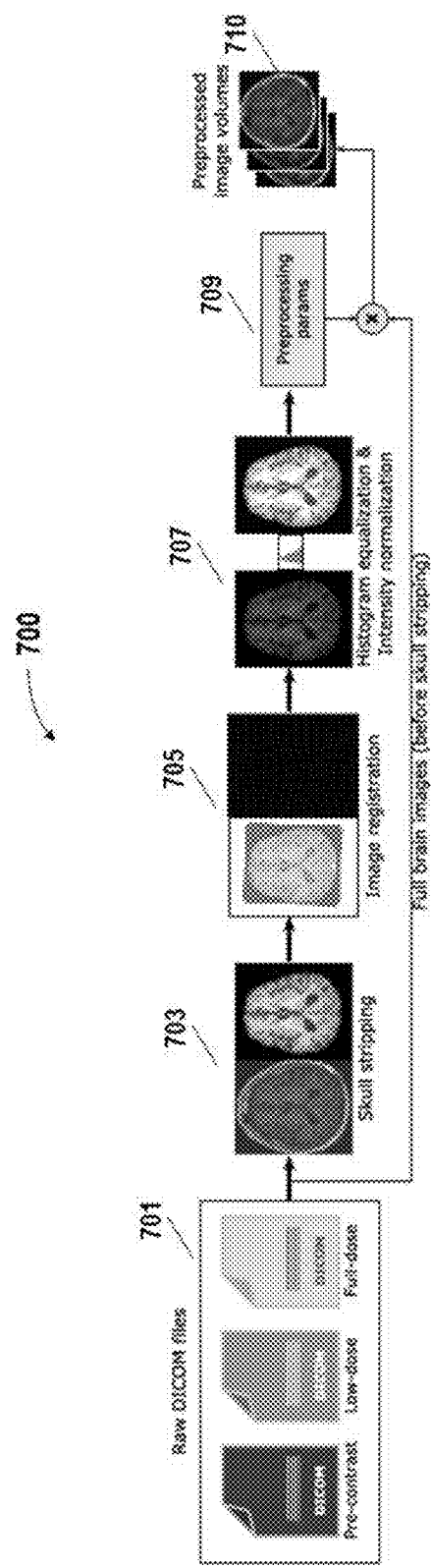
FIG. 7 shows an example of a pre-processing method, in accordance with some embodiments herein.

In some cases, the input datasets may be pre-processed prior to training or inference. FIG. 7 shows an example of a pre-processing method 700, in accordance with some embodiments herein. As shown in the example, the input data including the raw pre-contrast, low-dose, and full-dose image (i.e., ground truth) may be sequentially preprocessed to generate preprocessed image data 710. The raw image data may be received from a standard clinical workflow, as a DICOM-based software application or other imaging software applications. As an example, the input data 701 may be acquired using a scan protocol as described in FIG. 5. For instance, three scans including a first scan with zero contrast dose, a second scan with a reduced dose level and a third scan with full dose may be operated. The reduced dose image data used for training the model, however, can include images acquired at various reduced dose level such as no more than 1%, 5%, 10%, 15%, 20%, any number higher than 20% or lower than 1%, or any number in-between. For example, the input data may include image data acquired from two scans including a full dose scan as ground truth data and a paired scan at a reduced level (e.g., zero dose or any level as described above). Alternatively, the input data may be acquired using more than three scans with multiple scans at different levels of contrast dose. Additionally, the input data may comprise augmented datasets obtained from simulation. For instance, image data from clinical database may be used to generate low quality image data mimicking the image data acquired with reduced contrast dose. In an example, artifacts may be added to raw image data to mimic image data reconstructed from images acquired with reduced contrast dose.

In the illustrated example, pro-processing algorithm such as skull-stripping 703 may be performed to isolate the brain image from cranial or non-brain tissues by eliminating signals from extra-cranial and non-brain tissues using the DL-based library. Based on the tissues, organs and use application, other suitable preprocessing algorithms may be adopted to improve the processing speed and accuracy of diagnosis. In some cases, to account for patient movement between the three scans, the low-dose and full-dose images may be co-registered to the pre-contrast image 705. In some cases, given that the transmit and receive gains may vary for different acquisitions, signal normalization may be performed through histogram equalization 707. Relative intensity scaling may be performed between the pre-contrast, low-dose, and full-dose for intra-scan image normalization. As the multi-institutional dataset include images with different voxel and matrix sizes, the 3D volume may be interpolated to an isotropic resolution of 0.5 mm$^3$ and wherever applicable, zero-padded images at each slice to a dimension of 512×512. The image data may have sufficiently high resolution to enable the DL network to learn small enhancing structures, such as lesions and metastases. In some cases, scaling and registration parameters may be estimated on the skull-stripped images and then applied to the original images 709. The preprocessing parameters estimated from the skull-stripped brain may be applied to the original images to obtain the preprocessed image volumes 710.

Next, the preprocessed image data 710 is used to train an encoder-decoder network to reconstruct the contrast-enhanced image. The network may be trained with an assumption that the contrast signal in the full-dose is a non-linearly scaled version of the noisy contrast uptake between the low-dose and the pre-contrast images. The model may not explicitly require the difference image between low-dose and pre-contrast.

Figure 8:
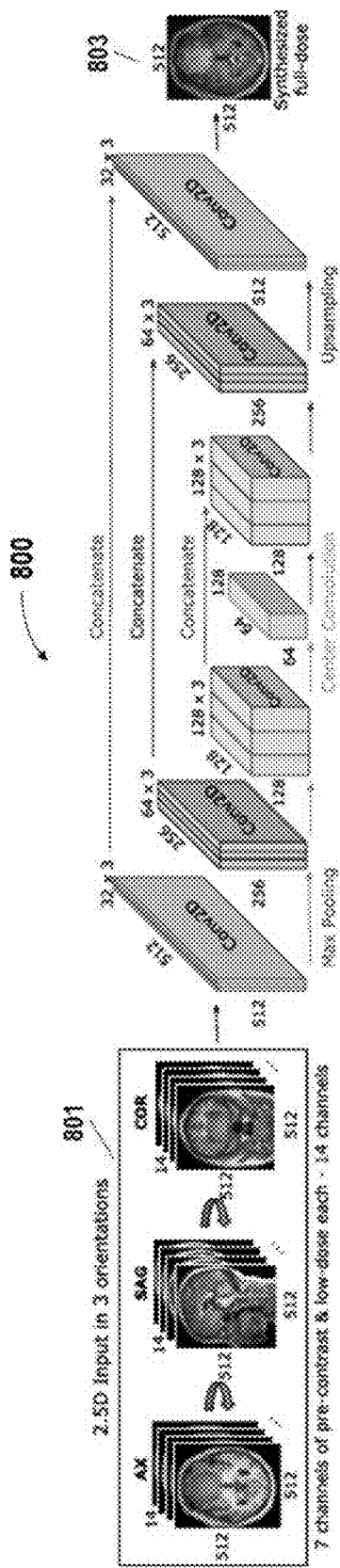
FIG. 8 shows an example of a U-Net style encoder-decoder network architecture, in accordance with some embodiments herein.

FIG. 8 shows an example of a U-Net style encoder-decoder network architecture 800, in accordance with some embodiments herein. In the illustrated example, each encoder block has three 2D convolution layers (3×3) with ReLU followed by a maxpool (2×2) to downsample the feature space by a factor of two. The decoder blocks have a similar structure with maxpool replaced with upsample layers. To restore spatial information lost during downsampling and prevent resolution loss, decoder layers are concatenated with features of the corresponding encoder layer using skip connections. The network may be trained with a combination of L1 (mean absolute error) and structural similarity index (SSIM) losses. Such U-Net style encoder-decoder network architecture may be capable of producing a linear 10× scaling of the contrast uptake between low-dose and zero-dose, without picking up noise along with the enhancement signal.

As shown in FIG. 8, the input data to the network may be a plurality of augmented volumetric images generated using the MPR method as described above. In the example, seven slices each of pre-contrast and low-dose images are stacked channel-wise to create a 14-channel input volumetric data for training the model to predict the central full-dose slices 803.

Enhancement and Weighted L1 Loss

In some situations, even after signal normalization and scaling is applied, the difference between the low-dose and pre-contrast images may have enhancement-like noise perturbations which may mislead training of the network. To make the network pay more attention to the actual enhancement regions, the L1 loss may be weighted with an enhancement mask. The mask is continuous in nature and is computed from the skull-stripped difference between low-dose and pre-contrast images, normalized between 0 and 1. The enhancement mask can be considered as a normalized smooth version of the contrast uptake.

Perceptual and Adversarial Losses

It is desirable to train the network to focus on the structural information in the areas of enhancement as well as high frequency and texture details which are crucial for making confident diagnostic decisions. A simple combination of L1 and structural similarity index (SSIM) losses may tend to suppress high-frequency signal information and the obtained results may have a smoother appearance, which is perceived as a loss of image resolution. To address this issue, a perceptual loss from a convolutional network (e.g., VGG-19 network consisting of 19 layers including 6 convolution layers, 3 Fully connected layer, 5 MaxPool layers and 1 SoftMax layer which is pre-trained on ImageNet dataset) is employed. The perceptual loss is effective in style-transfer and super-resolution tasks. For example, the perceptual loss can be computed from the third convolution layer of the third block (e.g., block3 conv3) of a VGG-19 network, by taking the mean squared error (MSE) of the layer activations on the ground truth and prediction.

Figure 9:
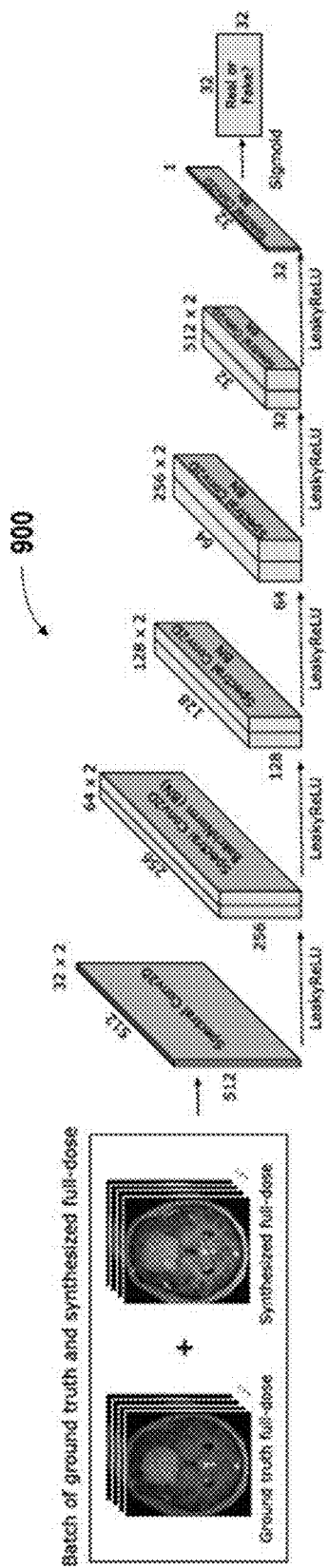
FIG. 9 shows an example of the discriminator, in accordance with some embodiments herein.

In some cases, to further improve the overall perceptual quality, an adversarial loss is introduced through a discriminator, trained in parallel to the encoder-decoder network, to predict whether the generated image is real or fake. FIG. 9 shows an example of the discriminator 900, in accordance with some embodiments herein. The discriminator 900 has a series of spectral normalized convolution layers with Leaky ReLU activations and predicts a 32×32 patch. Unlike a conventional discriminator, which predicts a binary value (e.g., 0 for fake and 1 for real), the "patch discriminator" 900 predicts a matrix of probabilities which helps in the stability of the training process and faster convergence. The spectral normalized convolution layer employs a weight normalization technique to further stabilize discriminator training. The patch discriminator, as shown in FIG. 9, can be trained with MSE loss, and Gaussian noise may be added to the inputs for smooth convergence.

The function for configuring the network model can be formulated as below:

$$G^* = \mathrm{argmin}_G [\lambda_{GAN} L_{GAN}(G) + \lambda_{L1} L_{L1}(M_{enh}, G) + \lambda_{SSIM} L_{SSIM}(G) + \lambda_{VGG} L_{VGG}(G)]$$

where $M_{enh}$ is the enhancement mask and the adversarial loss $L_{GAN}$ can be written as $L_{GAN} = \max_D L_{GAN}(G, D)$, where G is the U-Net generator and D is the patch-discriminator. The loss weights $\lambda_L$, $\lambda_{SSIM}$, $\lambda_{VGG}$ and $\lambda_{GAN}$ can be determined empirically. With the abovementioned processes and methods, a single model is trained to make accurate predictions on images from various institutions and scanners.

Example

FIG. 3 shows an example of analytic results of a study to evaluate the generalizability and accuracy of the provided model. In the illustrated example, the results show comparison of ground-truth (left), original model (middle), and proposed model (right) inference result on a test case from Site 1 (red arrow shows lesion conspicuity). The conventional model was trained on data from Site 2 only. This example is consistent with the MRI scanning data illustrated in FIG. 2. The provided model was trained on data from both sites, and used MPR processing and resolution resampling. In this study, the result qualitatively shows the effect of MPR processing on one example from the test set. By averaging the result of many MPR reconstructions, streaking artifacts that manifest as false enhancement are suppressed. As shown in FIG. 3, one slice of a ground-truth contrast-enhanced image (left) is compared to the inference results from the model trained on Site 2 (middle) and the model trained on Sites 1 and 2 simultaneously (right). By accounting for differences in resolution and other protocol deviations, the provided model demonstrates qualitative improvement in generalizability. Quantitative image quality metrics such as peak signal to noise ratio (PSNR), and structural similarity (SSIM) were calculated for all the conventional model and the presented model. The average PSNR and SSIM on the test set for the conventional and presented model was 32.81 dB (38.12 dB) and 0.872 (0.951), respectively. Better image quality may be achieved using the methods and systems in the present disclosure.

In the study as illustrated in FIG. 3, a deep learning (DL) framework as described elsewhere herein is applied for low-dose (e.g., 10%) contrast-enhanced MRI. For each participant, two 3D $T_1$-weighted images were obtained: pre-contrast and post-10% dose contrast (0.01 mmol/kg). For training and clinical validation, the remaining 90% of the standard contrast dose (full-dose equivalent, 100%-dose) was administrated and a third 3D $T_1$-weighted image (100%-dose) was obtained. Signal normalization was performed to remove systematic differences (e.g., transmit and receive gains) that may have caused signal intensity changes between different acquisitions across different scanner platforms and hospital sites. Then, nonlinear affine co-registration between pre-dose, 10%-dose, and 100%-dose images were performed. The DL model used a U-Net encoder-decoder architecture, with the underlying assumption that the contrast-related signal between pre-contrast and low-dose contrast-enhanced images was nonlinearly scaled to the full-dose contrast images. Images from other contrasts such as $T_2$ and $T_2$-FLAIR can be included as part of the input to improve the model prediction.

As another example of an experiment in connection with FIG. 10-FIG. 13, data distribution and heterogeneity of a study dataset from three institutions, three different manufacturers, and eight different scanner models are shown in FIG. 10. The study retrospectively identified 640 patients (323 females; 52±16 years), undergoing clinical brain MRI exams from three institutions, three scanner manufacturers and eight scanner models using different institutional scan protocols, including different imaging planes, field strengths, voxel sizes, matrix sizes, use of fat suppression, contrast agents and injection methods. The clinical indications included suspected tumor, post-op tumor follow-up, routine brain, and others requiring MRI exams with GBCAs. Each subject underwent 3D pre-contrast T1w imaging, followed by a low-dose contrast-enhanced T1w scan with 10% (0.01 mmol/kg) of the standard dose (0.1 mmol/kg). For training and evaluation, a third 3D T1w image was obtained with the remaining 90% (0.09 mmol/kg) of the full dose, which was considered as the ground truth. All three acquisitions were made in a single imaging session, and the patients did not receive any additional gadolinium dose compared to the standard protocol.

Figure 11:
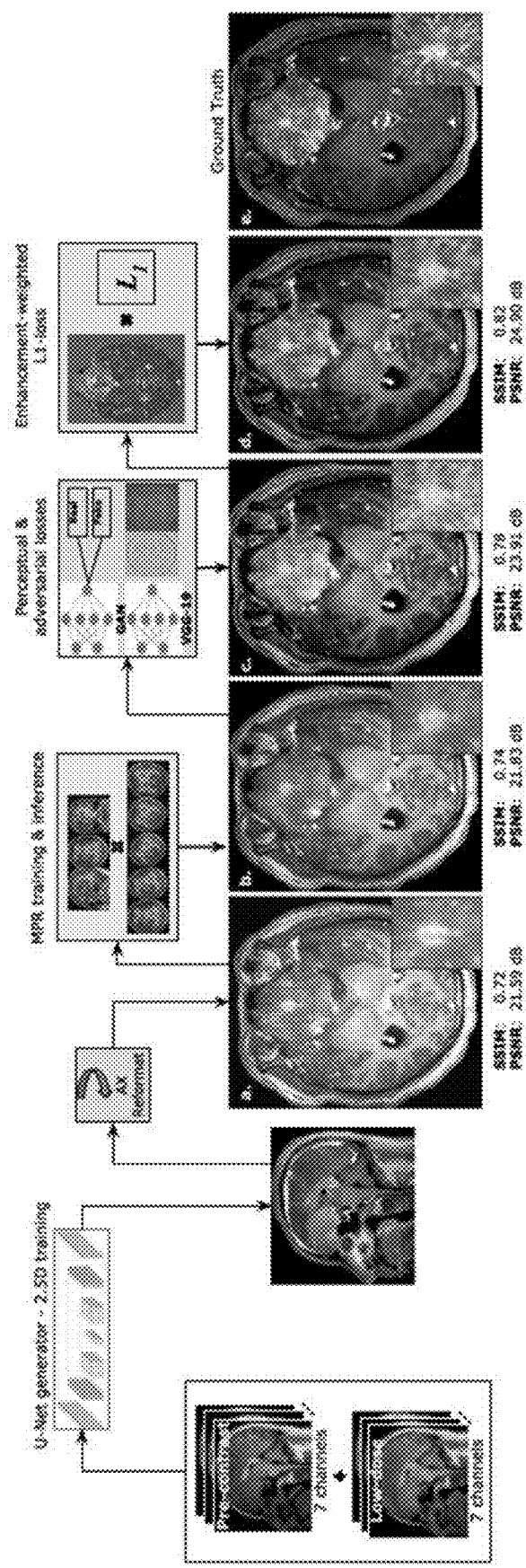
FIG. 11 schematically illustrates systems and methods that are utilized to monotonically improve the image quality.

Out of 640 cases, the model as shown in FIG. 11 was trained with 56 cases, and 13 validation cases were used to fine-tune the hyper-parameters and empirically find the optimal combination of loss weights. To ensure that the model generalizes well across sites and vendors, the train and validation sets consisted of approximately an equal number of studies from all the institutions and scanner manufacturers (refer FIG. 10). The remaining 571 cases were held-out for testing and model evaluation. The model was implemented in Python 3.5 using Keras with Tensorflow backend and was trained on Nvidia Tesla V100 (SXM2 32 GB) GPU for 100 epochs with a batch size of 8. Model optimization was performed using Adam optimizer with a learning rate of 0.001.

The model is quantitatively evaluated using a plurality of metrics. Peak signal-to-noise ratio (PSNR) is the scaled version of pixel-wise differences, whereas structural similarity index (SSIM) is sensitive to changes in local structure and hence captures the structural aspect of the predicted image with respect to the ground truth. Using the 571 test cases, the model was quantitatively evaluated using the PSNR and SSIM metrics, computed between the true full-dose and synthesized images. These values were compared with the PSNR and SSIM values between low-dose and full-dose images. Per-site and per-scanner metrics were also calculated and compared to prove model generalizability.

From the test set, a subset of images from 26 patients (13 males; 58±15 years), with different types and grades of enhancing tumor cases (either pre- or post-operative) were identified and used for an in-depth evaluation of model performance. These enhancing tumor cases were similar to the training dataset in terms of heterogeneity and were acquired using the same scanning protocol as shown in FIG. 5. A binary assessment was performed to find if the enhancement pattern agreed without any false positives or false negatives (with true full-dose images as the reference). When present, image artifacts in the synthesized images were recorded and the image artifacts are proved to be reduced with aid of the provided model.

To further validate that the model predictions were similar to the full-dose ground truth, automatic tumor segmentation is performed on the 26 enhancing tumor cases. The variant of the model applied, used only post-contrast images to segment the tumor core. As per the requirements of the segmentation model, the ground truth and predicted full-dose images were skull-stripped, interpolated to 1 mm³ resolution and co-registered to an anatomical template. The evaluation is performed by computing the Dice scores of the predicted tumor core between the segmented masks of the ground-truth and those created using the synthesized images.

FIG. 11 schematically illustrates systems and methods are utilized to monotonically improve the image quality. The example is shown for a sagittally acquired MR image with an enhancing frontal tumor. Vertical streaks can be seen in the axial reformat of the 2.5D model result as shown in panel a, which was fixed by MPR training and inference as shown in panel b. Adding perceptual and adversarial losses further improves the texture inside the tumor and restored overall perceptual quality as shown panel c. Additionally, weighting the L1 loss with the smooth enhancement mask matched the enhancement pattern to that of the ground truth, as shown in panel d. The monotonic increase in the metrics with respect to the ground truth (as shown in panel e) also illustrates the improvement of model. Below table shows the model improvement for each of the proposed technical solutions for the 26 enhancing tumor cases.

| Metric | UNet 2D (35) | UNet 2.5D | +MPR | +VGG & GAN | +Enhancement mask* |
|---|---|---|---|---|---|
| PSNR (dB) | 31.84 ± 4.88 | 32.38 ± 4.67 | 33.56 ± 5.19 | 34.28 ± 4.88 | 35.22 ± 4.79 |
| SSIM | 0.88 ± 0.06 | 0.89 ± 0.06 | 0.90 ± 0.06 | 0.92 ± 0.05 | 0.93 ± 0.04 |

Figure 12:
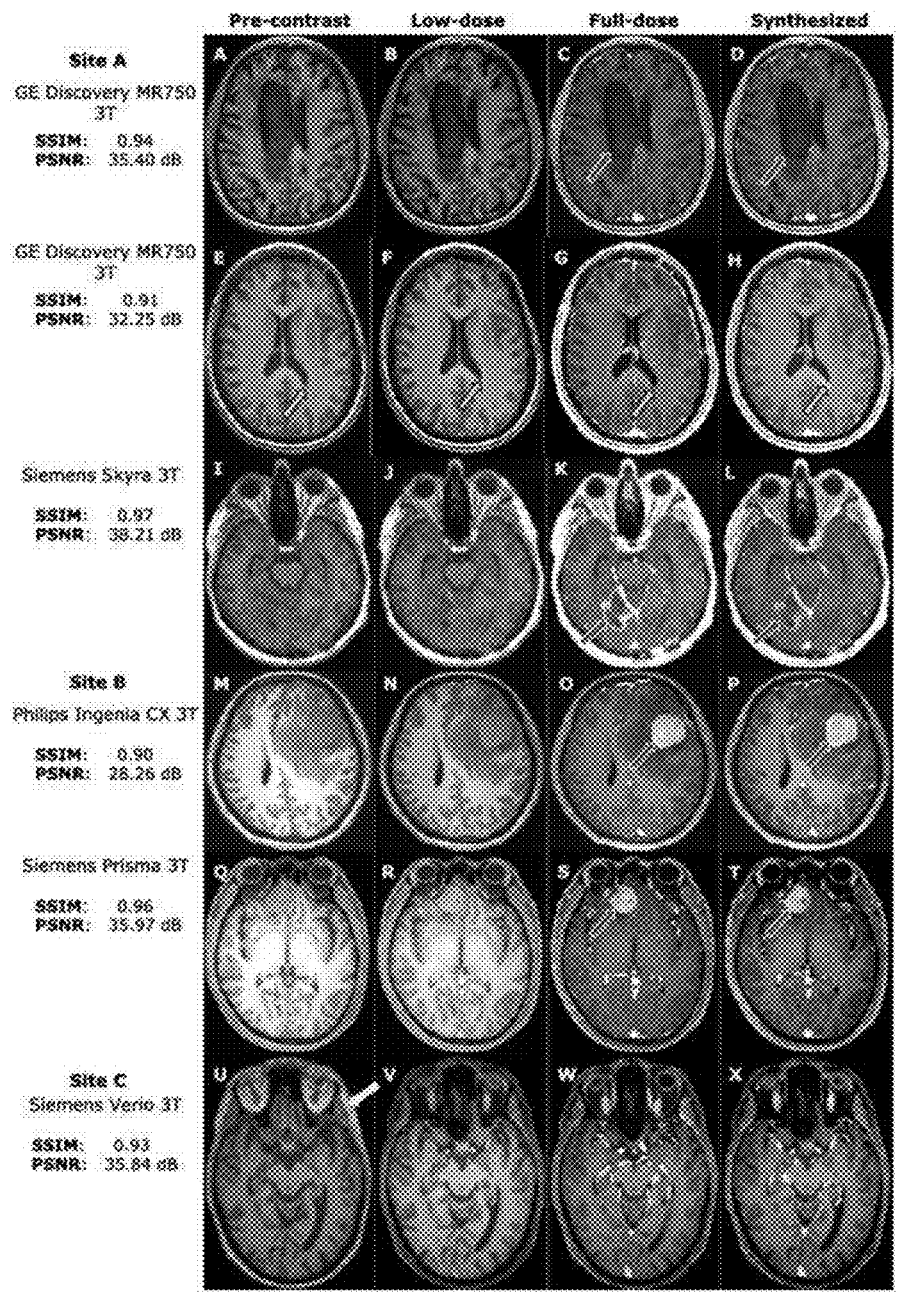
FIG. 12 shows examples of pre-contrast, low-dose, full-dose ground truth image data and synthesized images along with the quantitative metrics for cases from different sites and scanners.

FIG. 12 shows pre-contrast, low-dose, full-dose ground truth and synthesized images along with the quantitative metrics for cases from different sites and scanners. The metrics show that the model with the proposed technical improvements performed better than the original model (with metrics 31.84±4.88 dB, 0.88±0.06). The best performing model used MPR with five rotations with a combination of SSIM, perceptual, adversarial, and enhancement weighted L1 losses. For a 512×512×300 volume, preprocessing and inference of the best model took about 135 seconds on a GeForce RTX 2080 (16 GB) GPU.

FIG. 13 shows examples of different number of rotations and the corresponding effect on the quality of the image and the performance. The effect of the number of rotation angles in MPR as shown in FIG. 13 provides that greater number of angles may reduce the horizontal streaks inside the tumor (better quality), while it may also increase the inference time. When deploy a trained model to a physical site, the number of rotations and different angles may be determined based on the desired image quality and deployment environment (e.g., computational power, memory storage, etc.).

System Overview

Figure 4:
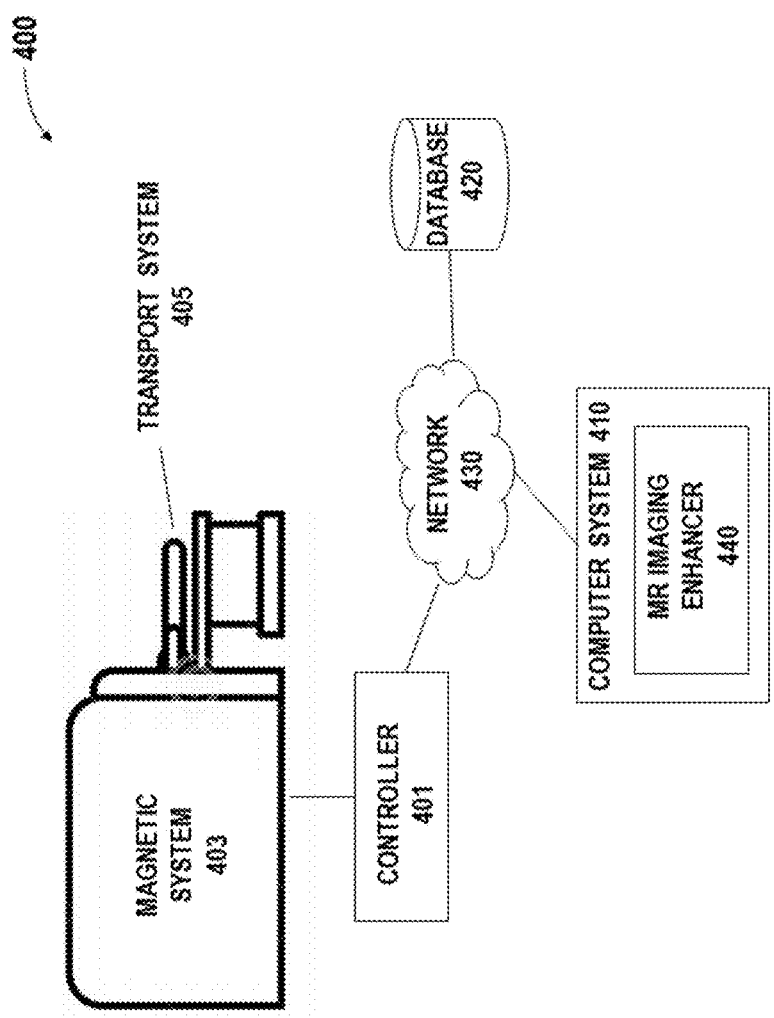
FIG. 4 schematically illustrates a magnetic resonance imaging (MRI) system in which an imaging enhancer of the presenting disclosure may be implemented.

The provided DL framework for low-dose contrast-enhanced MRI is capable of reducing the dosage of GBCA for contrast-enhanced MRI while preserving image quality and avoiding degradation in contrast enhancement. The robustness and generalizability of the DL model is improved thereby allowing for improved adaptation to various applications across a heterogeneous patient and site population. FIG. 4 schematically illustrates a magnetic resonance imaging (MRI) system 400 in which an imaging enhancer 440 of the presenting disclosure may be implemented. The MRI system 400 may comprise a magnet system 403, a patient transport table 405 connected to the magnet system, and a controller 401 operably coupled to the magnet system. In one example, a patient may lie on the patient transport table 405 and the magnet system 403 would pass around the patient. The controller 401 may control magnetic fields and radio frequency (RF) signals provided by the magnet system 403 and may receive signals from detectors in the magnet system 403.

The MRI system 400 may further comprise a computer system 410 and one or more databases operably coupled to the controller 401 over the network 430. The computer system 410 may be used for implementing the volumetric MR imaging enhancer 440. The volumetric MR imaging enhancer 440 may implement the DL framework and methods described herein. For example, the volumetric MR imaging enhancer may employ the MPR reconstruction method and various other training algorithms, and data processing methods described herein. The computer system 410 may be used for generating an imaging enhancer using training datasets. Although the illustrated diagram shows the controller and computer system as separate components, the controller and computer system can be integrated into a single component.

The computer system 410 may comprise a laptop computer, a desktop computer, a central server, distributed computing system, etc. The processor may be a hardware processor such as a central processing unit (CPU), a graphic processing unit (GPU), a general-purpose processing unit, which can be a single core or multi core processor, or a plurality of processors for parallel processing. The processor can be any suitable integrated circuits, such as computing platforms or microprocessors, logic devices and the like. Although the disclosure is described with reference to a processor, other types of integrated circuits and logic devices are also applicable. The processors or machines may not be limited by the data operation capabilities. The processors or machines may perform 512 bit, 256 bit, 128 bit, 64 bit, 32 bit, or 16 bit data operations.

The MRI system 400 may include one or more databases 420 that may utilize any suitable database techniques. For instance, structured query language (SQL) or "NoSQL" database may be utilized for storing the reconstructed/reformat image data, raw collected data, training datasets, trained model (e.g., hyper parameters), weighting coefficients, rotation angles, rotation numbers, orientation for reformat reconstruction, etc. Some of the databases may be implemented using various standard data-structures, such as an array, hash, (linked) list, struct, structured text file (e.g., XML), table, JSON, NOSQL and/or the like. Such data-structures may be stored in memory and/or in (structured) files. In another alternative, an object-oriented database may be used. Object databases can include a number of object collections that are grouped and/or linked together by common attributes; they may be related to other object collections by some common attributes. Object-oriented databases perform similarly to relational databases with the exception that objects are not just pieces of data but may have other types of functionality encapsulated within a given object. If the database of the present disclosure is implemented as a data-structure, the use of the database of the present disclosure may be integrated into another component such as the component of the present invention. Also, the database may be implemented as a mix of data structures, objects, and relational structures. Databases may be consolidated and/or distributed in variations through standard data processing techniques. Portions of databases, e.g., tables, may be exported and/or imported and thus decentralized and/or integrated.

The network 430 may establish connections among the components in the MRI platform and a connection of the MRI system to external systems. The network 430 may comprise any combination of local area and/or wide area networks using both wireless and/or wired communication systems. For example, the network 430 may include the Internet, as well as mobile telephone networks. In one embodiment, the network 430 uses standard communications technologies and/or protocols. Hence, the network 430 may include links using technologies such as Ethernet, 802.11, worldwide interoperability for microwave access (WiMAX), 2G/3G/4G/5G mobile communications protocols, InfiniBand, PCI Express Advanced Switching, etc. Other networking protocols used on the network 430 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), and the like. The data exchanged over the network can be represented using technologies and/or formats including image data in binary form (e.g., Portable Networks Graphics (PNG)), the hypertext markup language (HTML), the extensible markup language (XML), etc. In addition, all or some of links can be encrypted using conventional encryption technologies such as secure sockets layers (SSL), transport layer security (TLS), Internet Protocol security (IPsec), etc. In another embodiment, the entities on the network can use custom and/or dedicated data communications technologies instead of, or in addition to, the ones described above.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

As used herein A and/or B encompasses one or more of A or B, and combinations thereof such as A and B. It will be understood that although the terms "first," "second," "third" etc. are used herein to describe various elements, components, regions and/or sections, these elements, components, regions and/or sections should not be limited by these terms. These terms are merely used to distinguish one element, component, region or section from another element, component, region or section. Thus, a first element, component, region or section discussed herein could be termed a second element, component, region or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Reference throughout this specification to "some embodiments," or "an embodiment," means that a particular feature, structure, or characteristic described in connection with the embodiment is included in at least one embodiment. Thus, the appearances of the phrase "in some embodiment," or "in an embodiment," in various places throughout this specification are not necessarily all referring to the same embodiment. Furthermore, the particular features, structures, or characteristics may be combined in any suitable manner in one or more embodiments While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A computer-implemented method for improving image quality with reduced dose of contrast agent, the method comprising:
    (a) acquiring, using a medical imaging apparatus, a medical image of a subject with a reduced dose of contrast agent;
    (b) reformatting the medical image of the subject in multiple orientations to generate a plurality of reformat medical images; and
    (c) applying a deep network model to the plurality of reformat medical images to generate a predicted medical image with improved quality.

2. The computer-implemented method of claim 1, wherein the medical imaging apparatus is a transforming magnetic resonance (MR) device.

3. The computer-implemented method of claim 1, wherein the medical image is a 2.5D volumetric image.

4. The computer-implemented method of claim 1, wherein the multiple orientations include at least one orientation that is not in the direction of the scanning plane.

5. The computer-implemented method of claim 1, further comprising rotating each of the plurality of reformat medical images into various angles to generate a plurality of rotated reformat medical images.

6. The computer-implemented method of claim 5, further comprising applying the deep network model to the plurality of rotated reformat medical images to output a plurality of predicted images.

7. The computer-implemented method of claim 6, wherein the plurality of predicted images are rotated to be aligned to a scanning plane.

8. The computer-implemented method of claim 7, further comprising averaging the plurality of predicted images after rotated to be aligned to the scanning plane to generate the predicted medical image with improved quality.

9. The computer-implemented method of claim 1, wherein the predicted medical image with improved quality is obtained by averaging a plurality of predicted medical images corresponding to the plurality of the reformat medical images.

10. The computer-implemented method of claim 1, wherein parameters of the deep learning model are tuned based at least in part on a perceptual loss or adversarial loss.

11. A non-transitory computer-readable storage medium including instructions that, when executed by one or more processors, cause the one or more processors to perform operations comprising:

(a) acquiring, using a medical imaging apparatus, a medical image of a subject with a reduced dose of contrast agent;
(b) reformatting the medical image of the subject in multiple orientations to generate a plurality of reformat medical images; and
(c) applying a deep network model to the plurality of reformat medical images to generate a predicted medical image with improved quality.

12. The non-transitory computer-readable storage medium of claim 11, wherein the medical imaging apparatus is a transforming magnetic resonance (MR) device.

13. The non-transitory computer-readable storage medium of claim 11, wherein the medical image is a 2.5D volumetric image.

14. The non-transitory computer-readable storage medium of claim 1, wherein the multiple orientations include at least one orientation that is not in the direction of the scanning plane.

15. The non-transitory computer-readable storage medium of claim 1, wherein the operations further comprise rotating each of the plurality of reformat medical images into various angles to generate a plurality of rotated reformat medical images.

16. The non-transitory computer-readable storage medium of claim 15, wherein the operations further comprise applying the deep network model to the plurality of rotated reformat medical images to output a plurality of predicted images.

17. The non-transitory computer-readable storage medium of claim 16, wherein the plurality of predicted images are rotated to be aligned to a scanning plane.

18. The non-transitory computer-readable storage medium of claim 17, wherein the operations further comprise averaging the plurality of predicted images after rotated to be aligned to the scanning plane to generate the predicted medical image with improved quality.

19. The non-transitory computer-readable storage medium of claim 11, wherein the predicted medical image with improved quality is obtained by averaging a plurality of predicted medical images corresponding to the plurality of the reformat medical images.

20. The non-transitory computer-readable storage medium of claim 11, wherein parameters of the deep learning model are tuned based at least in part on a perceptual loss or adversarial loss.

* * * * *